(12) United States Patent
Peng et al.

(10) Patent No.: US 11,082,788 B2
(45) Date of Patent: Aug. 3, 2021

(54) COMPOSITE ELECTRODE, ACOUSTIC SENSOR USING THE SAME, AND MANUFACTURING METHOD THEREOF

(71) Applicants: BOE TECHNOLOGY GROUP CO., LTD., Beijing (CN); Hefei Xinsheng Optoelectronics Technology Co., Ltd., Anhui (CN)

(72) Inventors: Rui Peng, Beijing (CN); Qinghe Wang, Beijing (CN); Xiang Wan, Beijing (CN); Xinwei Gao, Beijing (CN); Xinxin Wang, Beijing (CN); Zhaokang Fan, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 378 days.

(21) Appl. No.: 16/305,229

(22) PCT Filed: Mar. 27, 2018

(86) PCT No.: PCT/CN2018/080653
§ 371 (c)(1),
(2) Date: Nov. 28, 2018

(87) PCT Pub. No.: WO2018/223752
PCT Pub. Date: Dec. 13, 2018

(65) Prior Publication Data
US 2021/0014625 A1    Jan. 14, 2021

(30) Foreign Application Priority Data

Jun. 9, 2017 (CN) .......................... 201710431845.X

(51) Int. Cl.
*H04R 31/00* (2006.01)
*H01L 27/20* (2006.01)
(Continued)

(52) U.S. Cl.
CPC ........... *H04R 31/003* (2013.01); *H01L 27/20* (2013.01); *H01L 41/04* (2013.01);
(Continued)

(58) Field of Classification Search
None
See application file for complete search history.

(56) References Cited

U.S. PATENT DOCUMENTS 9,424,829 B2    8/2016   Zhu
2007/0123618 A1*  5/2007   Bocian ................ G01N 27/305
                                                         524/202
(Continued)

FOREIGN PATENT DOCUMENTS

CN    101821898 A    9/2010
CN    102387452 A    3/2012
(Continued)

OTHER PUBLICATIONS

"New Scanning Probe Techniques for Analyzing Organic Photovoltaic Materials and Devices" by Giridharagopal et al. (Year: 2010).*
(Continued)

*Primary Examiner* — Evren Seven
(74) *Attorney, Agent, or Firm* — Arch & Lake LLP

(57) ABSTRACT

The present disclosure provides a composite electrode, an acoustic sensor using the composite electrode, and a manufacturing method of the composite electrode. The composite electrode includes a conductive layer, and a semiconductor high-molecular polymer layer formed on the conductive layer. The semiconductor high-molecular polymer layer has a three-dimensional mesh structure. The acoustic sensor
(Continued)

includes a base; the above-mentioned composite electrode formed on the base; an organic layer formed on the composite electrode; and a top electrode formed on the organic layer.

6 Claims, 2 Drawing Sheets

(51) Int. Cl.
  H01L 41/113 (2006.01)
  H01L 41/193 (2006.01)
  H01L 41/45 (2013.01)
  H04R 19/00 (2006.01)
  H01L 41/04 (2006.01)

(52) U.S. Cl.
  CPC ........ *H01L 41/1132* (2013.01); *H01L 41/193* (2013.01); *H01L 41/45* (2013.01); *H04R 19/005* (2013.01); *H04R 2231/003* (2013.01)

(56) References Cited

U.S. PATENT DOCUMENTS

| | | | |
|---|---|---|---|
| 2009/0267057 A1* | 10/2009 | Setayesh | G01N 27/414 257/40 |
| 2010/0119097 A1* | 5/2010 | Ohtsuka | H04R 1/04 381/361 |
| 2010/0323458 A1* | 12/2010 | Fritsch | H01L 41/319 438/3 |
| 2010/0328328 A1 | 12/2010 | Choi et al. | |
| 2015/0310848 A1 | 10/2015 | Zhu | |
| 2016/0133424 A1* | 5/2016 | Chou | H01L 33/38 257/11 |
| 2016/0277844 A1* | 9/2016 | Kopetz | H04R 19/005 |
| 2018/0198083 A1* | 7/2018 | Tanaka | H01G 9/2059 |
| 2019/0067608 A1* | 2/2019 | Wang | H04R 7/06 |
| 2019/0179470 A1* | 6/2019 | Hong | G06F 3/04144 |
| 2019/0393436 A1* | 12/2019 | Cotlet | H01L 51/0036 |
| 2020/0119206 A1* | 4/2020 | Lee | H01L 51/0072 |
| 2020/0203608 A1* | 6/2020 | Jang | H01L 27/1225 |
| 2021/0024674 A1* | 1/2021 | Yahagi | C08L 33/00 |

FOREIGN PATENT DOCUMENTS

| | | | | |
|---|---|---|---|---|
| CN | 102779964 A | | 11/2012 | |
| CN | 102791768 A | | 11/2012 | |
| CN | 103490010 | * | 1/2014 | ......... H01L 51/0001 |
| CN | 103916801 A | | 7/2014 | |
| CN | 103928622 A | | 7/2014 | |
| CN | 104051660 A | | 9/2014 | |
| CN | 102779964 B | | 3/2015 | |
| CN | 105244072 A | | 1/2016 | |
| CN | 105527015 A | | 4/2016 | |
| CN | 107222821 A | | 9/2017 | |

OTHER PUBLICATIONS

Chinese Office Action dated Mar. 5, 2019, from application No. 201710431845.X.

International Search Report and Written Opinion dated Jun. 27, 2018, from application No. PCT/CN2018/080653.

Polymer Chemistry Accepted Manuscript, www.rsc.org/polymers, 35 pages.

* cited by examiner

COMPOSITE ELECTRODE, ACOUSTIC SENSOR USING THE SAME, AND MANUFACTURING METHOD THEREOF

CROSS-REFERENCE

The present disclosure claims priority to International Application No. PCT/CN2018/080653 filed on Mar. 27, 2018, which is based upon Chinese Patent Application No. 201710431845.X filed on Jun. 9, 2017, the disclosure of which is incorporated herein by reference in its entirety as part of the present application.

TECHNICAL FIELD

The present disclosure relates to the field of acoustic sensor and display technology, and particularly to a composite electrode, an acoustic sensor using the composite electrode, and a manufacturing method of the composite electrode.

BACKGROUND

Organic light-emitting diode (OLED) display and lighting technologies have been increasingly developed in recent years. Especially, in the display industry, it has become one of hot points in panel display research areas. As compared to liquid crystal display (LCD), OLED display is advantageous in, such as, high response, high contrast ratio, low operation voltage, light weight and smaller thickness, flexibility, low power consumption, low manufacturing cost, self-luminous property, wider viewing angle and high-speed response. As a result, currently, OLED screens have been applied in display fields, such as, in mobile phone, PDA and digital camera, replacing the conventional LCD screens, and are considered to have extensive application prospect with important research significance. Depending on a direction of exiting light, OLED device may be classified into bottom-emission OLED device and top-emission OLED device.

Acoustic sensor/sound sensor is also referred to as sound-sensitive sensor, which is a component or device that converts mechanical vibrations propagated in gas, liquid or solid into electric signals. Such a sensor detects a signal in a contact or contactless way. The sound-sensitive sensor has plenty of types, and may be classified into piezoelectric type, electrostriction effect type, electromagnetic induction type, electrostatic effect type and magnetostriction effect type depending on their measurement principles.

How to utilize the characteristics of OLED and combine an OLED device with a sensor to manufacture an OLED acoustic sensor is the technical problem to be solved by the present disclosure.

The above information disclosed in the "BACKGROUND" portion is merely used to enhance the understanding of the context of the present disclosure, and hence may include information not constituting related technology which is well-known for those skilled in the art.

SUMMARY

The objective of the present disclosure is to provide a composite electrode, an acoustic sensor using the composite electrode, and a manufacturing method of the composite electrode, which utilize the characteristic of OLED and combines an OLED device with a sensor to manufacture an OLED acoustic sensor.

Other feature(s) and advantage(s) of the present disclosure will become more definite from the particular description below, or will be partly learned through a practice of the present disclosure.

According to the first aspect of the present disclosure, a composite electrode is disclosed. The composite electrode includes a conductive layer, and a semiconductor high-molecular polymer layer formed on the conductive layer. The semiconductor high-molecular polymer layer has a three-dimensional mesh structure.

In an exemplary arrangement of the present disclosure, the conductive layer is a polyethylenedioxythiophene-poly(styrenesulfonic acid) (PEDOT:PSS) layer.

In an exemplary arrangement of the present disclosure, the semiconductor high-molecular polymer includes a material having hole/electron injection function or a bipolar material.

In an exemplary arrangement of the present disclosure, the material having hole/electron injection function includes at least one of polyfluorene derivatives.

In an exemplary arrangement of the present disclosure, the bipolar material includes PBTPBF-BT.

According to the second aspect of the present disclosure, a manufacturing method of a composite electrode is disclosed. The method includes preparing a conductive layer; coating a solution of a mixture of a semiconductor high-molecular polymer and a small molecule polymer onto the conductive layer and curing the solution to form a uniform film. The method includes coating a solvent suitable for solving small molecule polymer onto the uniform film. The method includes spin-coating the uniform film to remove the small molecule polymer having been dissolved from the uniform film, so as to form a semiconductor high-molecular polymer layer having a three-dimensional mesh structure.

In an exemplary arrangement of the present disclosure, the small molecule polymer includes at least one of: polybutyl acrylate, poly(isobutyl methacrylate) and polymethyl methacrylate.

In an exemplary arrangement of the present disclosure, a content of the semiconductor high-molecular polymer occupied in the mixture of the semiconductor high-molecular polymer and the small molecule polymer is 20 wt %-60 wt %.

In an exemplary arrangement of the present disclosure, the solvent suitable for solving small molecule polymer is a polar solvent selected from the group consisting of acetone, isopropanol, and ethyl acetate.

According to the third aspect of the present disclosure, an acoustic sensor is disclosed. The acoustic sensor includes a base, the above-mentioned combination electrode formed on the base, an organic layer formed on the composite electrode, and a top electrode formed on the organic layer.

In an exemplary arrangement of the present disclosure, the acoustic sensor further includes a planarization layer formed between the composite electrode and the organic layer.

In an exemplary arrangement of the present disclosure, a material of the base is polyethylene glycol terephthalate (PET).

In an exemplary arrangement of the present disclosure, the organic layer includes a hole/electron transmission layer and an electroluminescence layer.

According to the fourth aspect of the present disclosure, an acoustic sensor array is disclosed. The acoustic sensor array includes a substrate, and a plurality of the above-mentioned acoustic sensors arranged in an array on the substrate.

In an exemplary arrangement of the present disclosure, the substrate is a flexible substrate.

According to some arrangements of the present disclosure, by using a three-dimensional mesh structure as a composite electrode, a sound vibration may cause a change of current, so as to change an area of exciton recombination as well as a color of light emitted by OLED through the change of current in an OLED device. A change of sound intensity and a change of vibrational frequency of sound wave result in a change of a color of the OLED device, which may be used for sound detection and monitor of earthquake wave in natural environment.

According to some arrangements of the present disclosure, by coating a solvent suitable for solving small molecule polymer onto a uniform film formed from a mixture of a semiconductor high-molecular polymer and a small molecule polymer and then spin-coating the uniform film, the small molecule polymer having been dissolved is removed from the uniform film, so as to form a semiconductor high-molecular polymer layer having a three-dimensional mesh structure.

According to some arrangements of the present disclosure, the above-mentioned coating is achieved by way of blade-coating.

According to some arrangements of the present disclosure, by utilizing characteristics of OLED per se, such as light weight and flexibility, the OLED acoustic sensor of the present disclosure may be made flexible so as to be applied in the fields of flexible electronics and electronic skin.

It should be understood that, the generic description above and the specific description below are merely illustrative and explanatory without limiting the present disclosure.

BRIEF DESCRIPTION OF THE DRAWINGS

Above and other objective(s), feature(s) and advantage(s) of the present disclosure will be more apparent from description of exemplary arrangements of the present disclosure with reference to the drawings.

The drawings herein incorporated into the description as a part of the description illustrate arrangements in accordance with the present disclosure and are used to explain the principle of the present disclosure in connection with the description. Obviously, the described drawings below are merely related to some of the arrangements of the present disclosure. For those ordinary skilled in the art, other drawings may be obtained according to these drawings without any creative labor.

DETAILED DESCRIPTION

Figure 1:
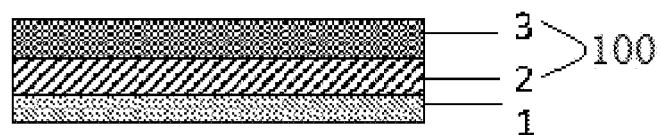
FIG. 1 illustrates a schematic diagram of a composite electrode according to an exemplary arrangement of the present disclosure.

Hereinafter, exemplary arrangements of the present disclosure will be described in a more complete way with reference to the drawings. However, the exemplary arrangements of the present disclosure may be implemented in various ways, and should not be interpreted as being limited to the exemplary arrangements herein; the described feature(s), structure(s) or characteristic(s) may be combined in one or more arrangement in any appropriate way. In the description below, plenty of details will be provided so that the arrangements of the present disclosure are fully understandable. However, those skilled in the art will be appreciated that, technical solution(s) of the present disclosure may be implemented without one or more of these specific details, or other method(s), element(s), device(s), block(s) and the like may be adopted.

It should be pointed out that, dimension(s) of layer(s) and area(s) in the drawings may be exaggerated for clarity of illustration. Moreover, it should be understood that, when an element or layer is referred to as being "on" another element or layer, it may be directly on another element, or an intermediate layer may be present. Additionally, it should be understood that, when an element or layer is referred to as being "below" another element or layer, it may be directly below another element, or more than one intermediate layer may be present. Additionally, it should also be understood that, when an element or layer is referred to as being "between" two elements or layers, it may be the one and only layer between the two elements or layers, or more than one intermediate layer or element may be present. Throughout the disclosure, similar reference marks indicate similar elements.

The objective of the present disclosure is to provide a composite electrode, an acoustic sensor using the composite electrode and a manufacturing method of a composite electrode. Utilizing the characteristic of OLED and combining an OLED device with a sensor to manufacture an OLED acoustic sensor. The composite electrode includes a conductive layer, and a semiconductor high-molecular polymer layer formed on the conductive layer, the semiconductor high-molecular polymer layer has a three-dimensional mesh structure. The acoustic sensor includes a base, the above-mentioned composite electrode formed on the base; an organic layer formed on the composite electrode; and a top electrode formed on the organic layer. By using a three-dimensional mesh structure as a composite electrode, a sound vibration may cause a change of current, so as to change an area of exciton recombination as well as a color of light emitted by OLED through the change of current in an OLED device. A change of sound intensity and a change of vibrational frequency of sound wave result in a change of a color of the OLED device, which may be used for sound detection and monitor of earthquake wave in natural environment. Additionally, by coating a solvent suitable for solving small molecule polymer onto a uniform film formed from a mixture of a semiconductor high-molecular polymer and a small molecule polymer and then spin-coating the uniform film, the small molecule polymer having been dissolved is removed from the uniform film, so as to form a semiconductor high-molecular polymer layer having a three-dimensional mesh structure.

Figure 2:
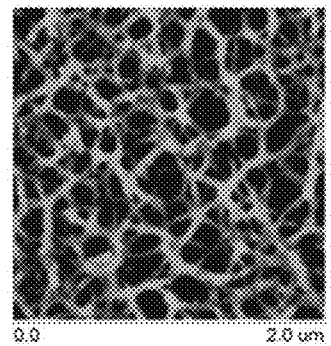
FIG. 2 illustrates a schematic diagram of a three-dimensional mesh structure in a semiconductor high-molecular polymer layer of a composite electrode according to an exemplary arrangement of the present disclosure.

Hereinafter, the composite electrode of the present disclosure will be described in connection with FIGS. 1-2, in which FIG. 1 illustrates a schematic diagram of a composite electrode according to an exemplary arrangement of the present disclosure, and FIG. 2 illustrates a schematic diagram of a three-dimensional mesh structure in a semiconductor high-molecular polymer layer of a composite electrode according to an exemplary arrangement of the present disclosure.

As illustrated in FIG. 1, the composite electrode 100 includes a conductive layer 2, and a semiconductor high-molecular polymer layer 3 formed on the conductive layer 2, the semiconductor high-molecular polymer layer 3 has a three-dimensional mesh structure. The three-dimensional mesh structure of the semiconductor high-molecular polymer layer 3 is as illustrated in FIG. 2, which illustrates a partial microscopic magnification of the three-dimensional mesh structure, with an area of 2 μm square. The three-dimensional mesh structure contains many mesh lines made of semiconductor high-molecular polymer, which will be vibrated by a vibration of sound, so as to change a current passing through the mesh lines, thus achieving a sense of sound. Herein, it should be particularly pointed out that, the composite electrode in the present disclosure is not limited to achieve the sense of sound but may sense any form of movement or energy which may cause a vibration of mesh line and hence cause a change of current passing through the mesh line.

In an exemplary arrangement of the present disclosure, the conductive layer is a polyethylenedioxythiophene-poly(styrenesulfonic acid) (PEDOT:PSS) layer.

In an exemplary arrangement of the present disclosure, the semiconductor high-molecular polymer is a material having hole/electron injection function or a bipolar material.

In an exemplary arrangement of the present disclosure, the material having hole/electron injection function may be polyfluorene derivatives, for example, the polyfluorene (PF) derivatives reported in the public literature "Zhu R, Wen G A, et al, Macromol Rapid Commun, 2005, 26: 1729".

In an exemplary arrangement of the present disclosure, the bipolar material may be PBTPBF-BT which is reported in the public literature "Zhang, Guobing; Ye, Zhiwei; et al, Polymer chemistry, 2015, 6(21), 3970-3978".

Figure 3:
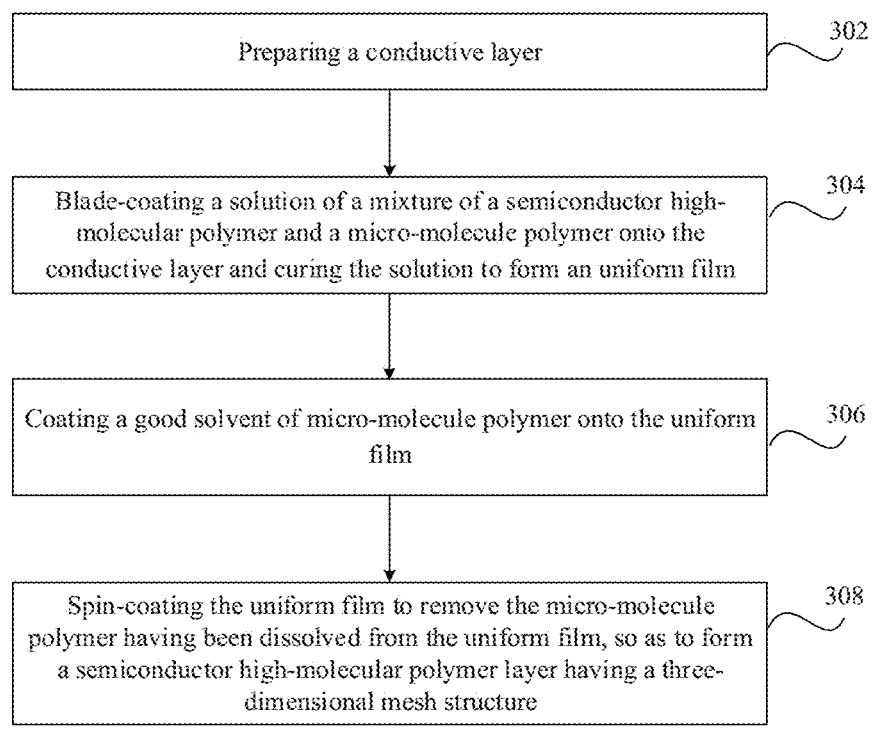
FIG. 3 illustrates a flow chart of a manufacturing method of a composite electrode according to an exemplary arrangement of the present disclosure.

FIG. 3 illustrates a flow chart of a manufacturing method of a composite electrode according to an exemplary arrangement of the present disclosure.

As illustrated in FIG. 3, in block S302, a conductive layer is prepared. The preparation of the conductive layer may be performed by coating a layer of PEDOT: PSS (e.g., coating a layer of PEDOT: PSS by way of blade-coating) on a substrate 1 (see FIG. 1), and curing the layer under a curing temperature of 120□ for a duration time of 10-15 min. By way of example, the substrate 1 may be made of polyethylene glycol terephthalate (PET) without limited thereto.

In block S304, a solution of a mixture of a semiconductor high-molecular polymer and a small molecule polymer is coated onto the conductive layer and the solution is cured to form a uniform film.

In an exemplary arrangement of the present disclosure, the semiconductor high-molecular polymer may be a material having hole/electron injection function or a bipolar material.

In an exemplary arrangement of the present disclosure, the material having hole/electron injection function may be polyfluorene derivatives, for example, the polyfluorene (PF) derivatives reported in the public literature "Zhu R, Wen G A, et al, Macromol Rapid Commun, 2005, 26: 1729".

In an exemplary arrangement of the present disclosure, the bipolar material may be PBTPBF-BT which is reported in the public literature "Zhang, Guobing; Ye, Zhiwei; et al, Polymer chemistry, 2015, 6(21), 3970-3978".

A molecular weight of the small molecule polymer may be selected in the range of 2000-3000, and the small molecule polymer may be polybutyl acrylate (PBA), poly(isobutyl acrylate) (PtBA) or polymethyl methacrylate (PMMA).

In block S306, a solvent suitable for solving small molecule polymer is coated onto the uniform film by, for example, blade-coating. The solvent may be a polar solvent selected from the group consisting of acetone, isopropanol, and ethyl acetate, which is a solvent having good dissolvability for small molecule polymer but poor dissolvability for high-molecular polymer.

In block S308, spin-coating process is performed on the uniform film to remove the small molecule polymer that has been dissolved from the uniform film, so as to form a semiconductor high-molecular polymer layer having a three-dimensional mesh structure.

After completing the foregoing block of coating the solvent suitable for solving small molecule polymer onto the uniform film, a phase separation will occur for the small molecule polymer which has been dissolved for a certain time. Then, the process of spin-coating the uniform film to remove the dissolved small molecule polymer from the uniform film is repeated, until a three-dimensional mesh structure of the semiconductor high-molecular polymer is formed. The three-dimensional mesh structure contains many mesh lines of semiconductor high-molecular polymer (still referring to FIG. 2), and a diameter of the mesh line in the mesh structure is controllable by a ratio of high-molecular polymer and small molecule polymer, and the ratio may be adjusted in the range of 20 wt %-60 wt %. The sensitivity of the resulted sensor may depend on the diameter of the mesh line.

Figure 4:
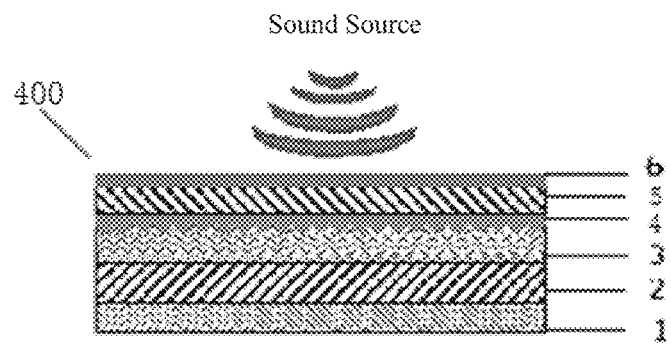
FIG. 4 illustrates a schematic diagram of an acoustic sensor according to an exemplary arrangement of the present disclosure.

Hereinafter, the acoustic sensor 400 of the present disclosure will be described in connection with FIG. 4. FIG. 4 illustrates a schematic diagram of an acoustic sensor according to an exemplary arrangement of the present disclosure.

As illustrated in FIG. 4, the acoustic sensor 400 includes: a base 1; the composite electrode 100 as described in the foregoing arrangements formed on the base 1, including a conductive 2 and a semiconductor high-molecular polymer layer 3 having a three-dimensional mesh structure; an organic layer 5 formed on the composite electrode; and a top electrode 6 formed on the organic layer 5.

The preparation of the base 1 and the composite electrode 100 may refer to the foregoing arrangements, without repeating the details herein.

In an exemplary arrangement of the present disclosure, the acoustic sensor may further include a planarization layer 4 formed between the composite electrode 100 and the organic layer 5. The preparation of the planarization layer may include: firstly, preparing a silicon (Si) substrate; then etching the Si substrate to form micropores in a surface of the Si substrate, the micropore having a depth dimension of 50-100 nm and a diameter of 40-100 nm; processing the Si substrate with octadecyltrichlorosilane (OTS) to achieve a certain lyophobic effect; then manufacturing a transfer layer of PEDOT: PSS on the Si substrate, i.e., coating a layer of PEDOT: PSS on the surface of the Si substrate provided with the micropore and curing the layer under a temperature of 120° for a duration time of 10-15 min to prepare a PEDOT: PSS film layer with a protrusion at a bottom side; finally, transferring the PEDOT: PSS film layer with the protrusion onto a surface of the three-dimensional mesh structure of the semiconductor high-molecular polymer layer 3 in the composite electrode 100 to increase an interface contact with the three-dimensional mesh structure and also to increase a conductivity property. Herein, it should be particularly pointed out that, the planarization layer is not necessary for the acoustic sensor in the present disclosure but only is an exemplary arrangement.

Subsequently, preparing an organic layer 5 and an electrode layer 6 on the planarization layer 4 (or the semiconductor high-molecular polymer layer 3) so as to form an OLED acoustic sensor. The organic layer 5 may include a hole/electron transmission layer and an electroluminescence layer (EML); the hole transmission layer may be NPB, and the electroluminescence layer (EML) may be NPB: Rubrene, or, the hole transmission layer is BCP and the electroluminescence layer (EML) is NPB: DCJTB. Materials of the electron/hole and the EML of the OLED acoustic sensor allow an area of carrier recombination and a color of light emitted by the OLED to be changed with the change of the current in the OLED device.

In the OLED acoustic sensor of the present implementation, by utilizing a composite electrode including a three-dimensional mesh structure, a sound vibration may cause a change of current, so as to change an area of exciton recombination as well as a color of light emitted by OLED through the change of current in an OLED device. A change of sound intensity and a change of vibrational frequency of sound wave result in a change of a color of the OLED device, which may be used for sound detection and monitor of earthquake wave in natural environment. Moreover, when the sound vibration disappears, the OLED device restores to its initial state for recycling. At the same time, because the OLED device, per se, has characteristics of light weight and flexibility, the OLED acoustic sensor may be made flexible, so as to be applied in the fields of flexible electronics and electronic skin.

Figure 5:
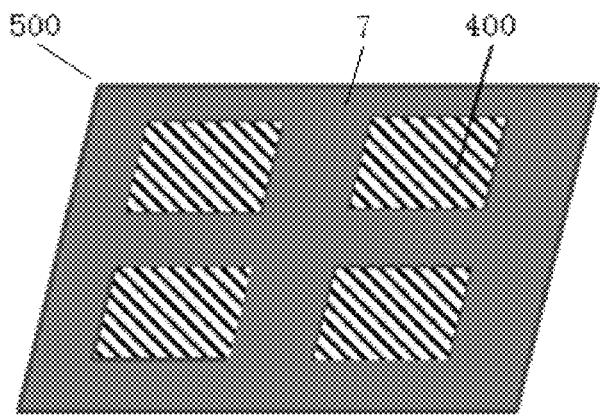
FIG. 5 illustrates a schematic diagram of an acoustic sensor array according to an exemplary arrangement of the present disclosure.

FIG. 5 illustrates a schematic diagram of an acoustic sensor array according to an exemplary arrangement of the present disclosure.

As illustrated in FIG. 5, the acoustic sensor array 500 includes a substrate 7 and a plurality of acoustic sensors 400 described in the foregoing arrangements which are arranged on the substrate in an array.

In an exemplary arrangement of the present disclosure, the substrate 7 is a flexible substrate.

Additionally, it should also be particularly explained that, the three-dimensional mesh structure in the foregoing arrangements is prepared on the composite electrode, but it may also be prepared in a charge generation layer (CGL) in the OLED acoustic sensor and be configured to connect OLED acoustic sensors in different units.

From the detailed description above, those skilled in the art may be easily appreciated that, the composite electrode, the acoustic sensor using the composite electrode and the manufacturing method of the composite electrode have one or more of the following advantages.

According to some arrangements of the present disclosure, by using a three-dimensional mesh structure as a composite electrode, a sound vibration may cause a change of current, so as to change an area of exciton recombination as well as a color of light emitted by OLED through the change of current in an OLED device. A change of sound intensity and a change of vibrational frequency of sound wave result in a change of a color of the OLED device, which may be used for sound detection and monitor of earthquake wave in the natural environment.

According to some arrangements of the present disclosure, by coating a solvent suitable for solving small molecule polymer onto a uniform film formed from a mixture of a semiconductor high-molecular polymer and a small molecule polymer and then spin-coating the uniform film, the small molecule polymer having been dissolved is removed from the uniform film, so as to form a semiconductor high-molecular polymer layer having a three-dimensional mesh structure.

According to some arrangements of the present disclosure, by utilizing characteristics of OLED per se, such as light weight and flexibility, the OLED acoustic sensor of the present disclosure may be made flexible so as to be applied in the fields of flexible electronics and electronic skin.

By considering the specification and practicing the current disclosure, other implementing mode(s) may be easily conceivable for those skilled in the art. The present disclosure is intended to cover any variation, purpose or adaptive modification of the present disclosure which is in accordance with the generic principle of the present disclosure and to include common knowledge or conventional technical measures in the technical field to which the present disclosure pertains. The specification and the arrangement(s) are merely deemed as exemplary, and the true scope and spirit of the present disclosure are indicated by the appended claims.

It should be understood that, the present disclosure is not limited to the exact structure(s) described in the above and illustrated in the drawings, and may be modified and varied without departing from the scope thereof. The scope of the present disclosure is only defined by the appended claims.

What is claimed is:

1. A composite electrode, comprising:
a conductive layer; and
a semiconductor high-molecular polymer layer formed on the conductive layer, the semiconductor high-molecular polymer layer having a three-dimensional mesh structure.

2. The composite electrode according to claim 1, wherein the conductive layer is a polyethylenedioxythiophene-poly (styrenesulfonic acid) (PEDOT:PSS) layer.

3. The composite electrode according to claim 1, wherein the semiconductor high-molecular polymer layer is a material having hole/electron injection function.

4. The composite electrode according to claim 1, wherein the semiconductor high-molecular polymer layer is a bipolar material.

5. The composite electrode according to claim 3, wherein the material having hole/electron injection function belongs to at least one of polyfluorene derivatives.

6. The composite electrode according to claim 4, wherein the bipolar material is PBTPBF-BT.

* * * * *